United States Patent [19]
Ati et al.

[11] Patent Number: 5,810,613
[45] Date of Patent: Sep. 22, 1998

[54] CIRCUIT BOARD CONNECTING DEVICE

[75] Inventors: Babi Ati; Marc DeFrancesco; Ali Ghorbani, all of Richardson, Tex.

[73] Assignee: Fujitsu Network Communications, Inc., Richardson, Tex.

[21] Appl. No.: 618,321

[22] Filed: Mar. 20, 1996

[51] Int. Cl.⁶ .................................................. H01R 21/22
[52] U.S. Cl. .................... 439/157; 439/325; 439/359; 439/368
[58] Field of Search .............................. 439/61, 157, 159, 439/160, 631, 325, 327, 359, 361, 368

[56] References Cited

U.S. PATENT DOCUMENTS

| | | |
|---|---|---|
| 3,767,974 | 10/1973 | Donovan, Jr. et al. ................. 439/157 |
| 4,530,615 | 7/1985 | Katsuura et al. ....................... 439/160 |
| 4,740,164 | 4/1988 | Schulz et al. ........................... 438/157 |
| 4,821,150 | 4/1989 | Duthie et al. . |
| 4,914,552 | 4/1990 | Keemer .................................. 439/157 |
| 5,030,108 | 7/1991 | Babow et al. ........................... 439/157 |
| 5,057,971 | 10/1991 | Hautvast et al. . |
| 5,291,368 | 3/1994 | Conroy-Wass . |
| 5,339,221 | 8/1994 | Conroy-Wass et al. . |
| 5,406,453 | 4/1995 | Cusato et al. ............................. 439/61 |
| 5,472,347 | 12/1995 | Nordenstrom et al. . |
| 5,481,073 | 1/1996 | Singer et al. . |

OTHER PUBLICATIONS

IBM Technical Disclosure Bulletin (Guthridge, Himes and Kehley, "Modularized PC Assembly", Nov. 1977, pp. 1&2).

*Primary Examiner*—Gary F. Paumen
*Assistant Examiner*—Katrina Davis
*Attorney, Agent, or Firm*—Staas & Halsey

[57] ABSTRACT

A circuit board connecting device electrically connects exposed back ends of circuit boards when the front ends of the circuit boards are received in a holder. The connecting device has first connectors, second connectors and a connector substrate. The first connectors are attached respectively to the back ends of the circuit boards and extend lengthwise with the back ends of the circuit boards. The second connectors are adapted for connection respectively to the first connectors when the first and second connectors are aligned in a plane parallel to a plane in which the circuit boards extend. The connector substrate has the second connectors attached thereto, extending perpendicular therefrom. The second connectors are electrically connected to each other on the connector substrate. The connector substrate is fixedly attached to one of the circuit boards.

9 Claims, 9 Drawing Sheets

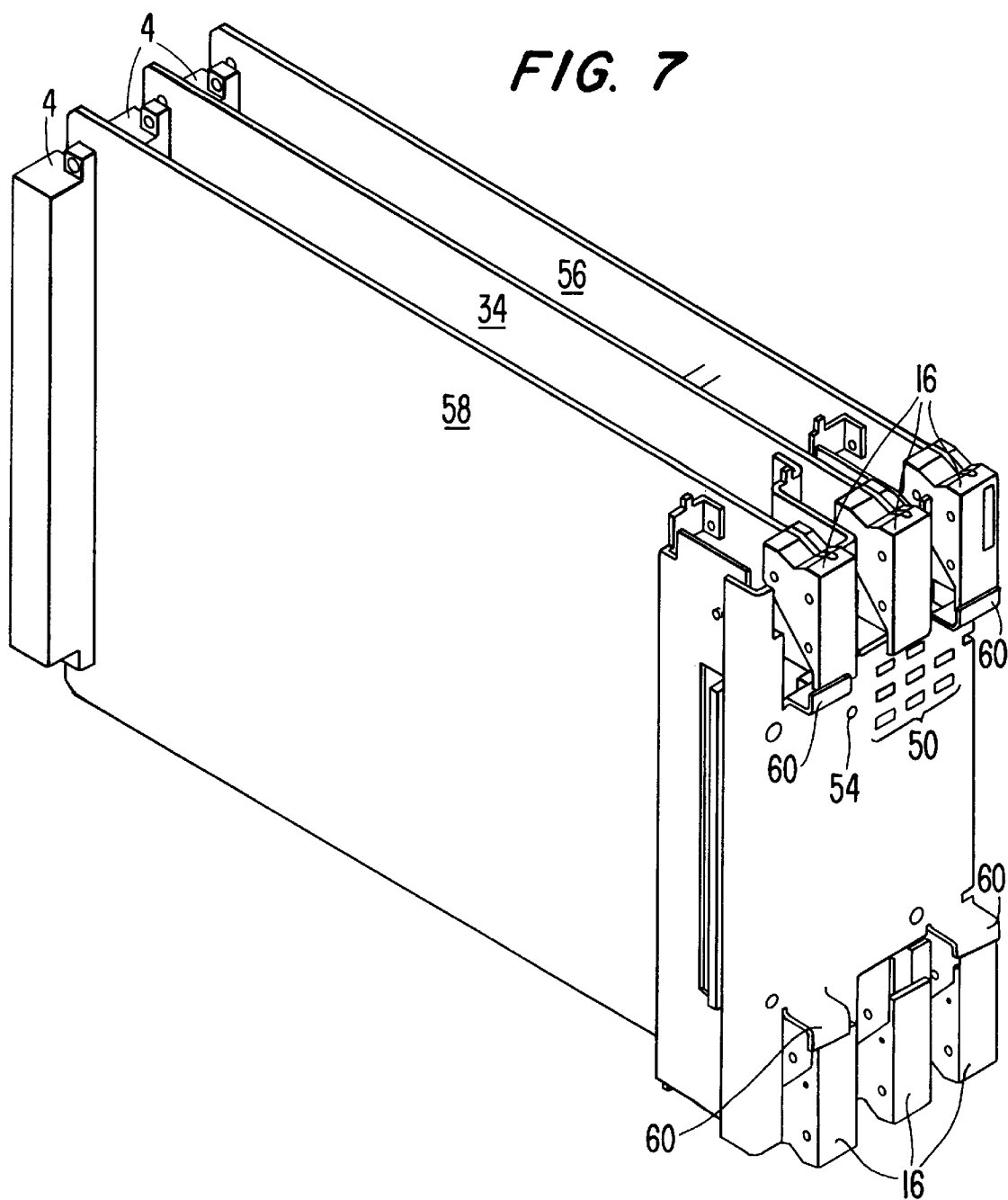

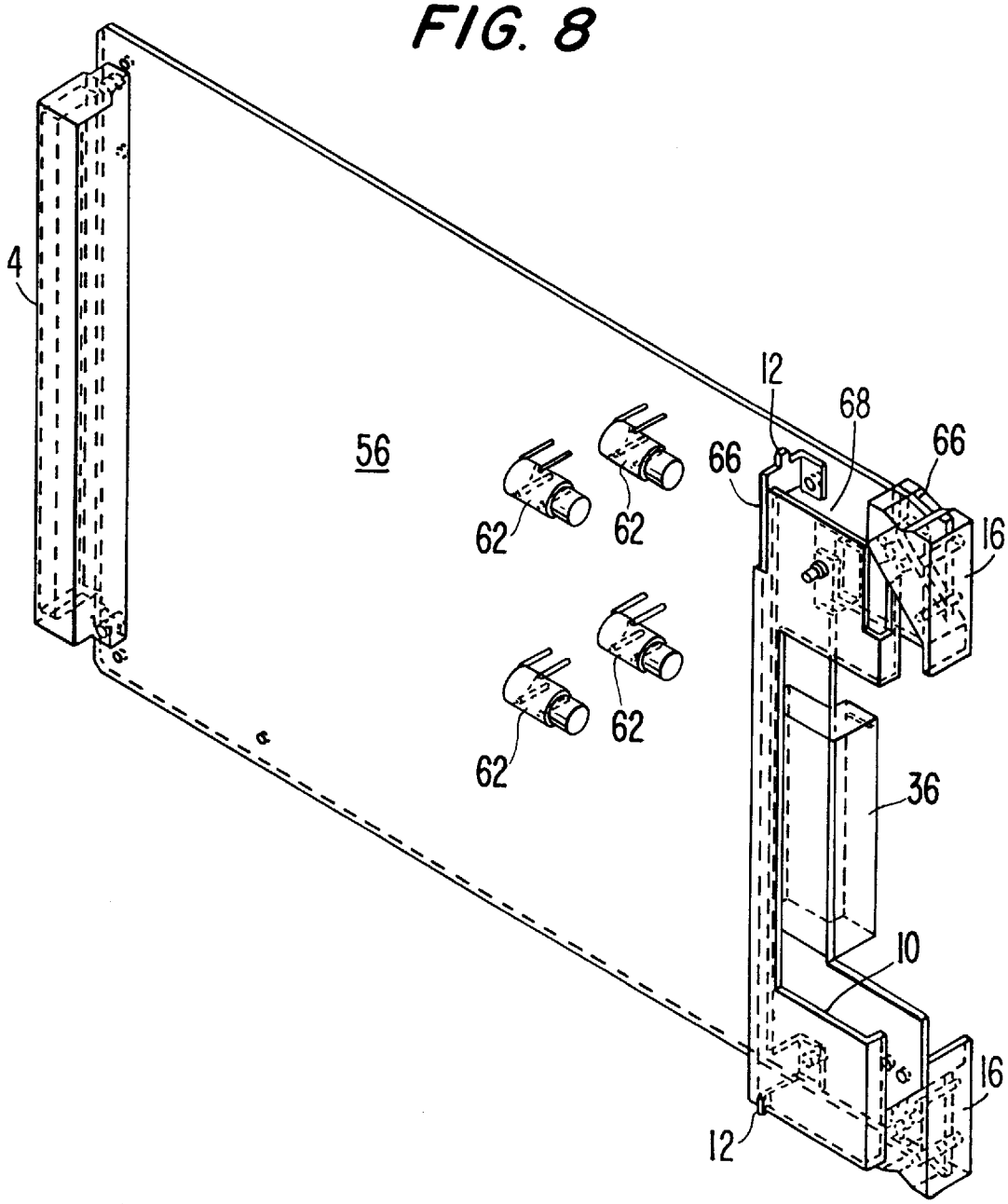

CIRCUIT BOARD CONNECTING DEVICE

BACKGROUND OF THE INVENTION

1. Field of the Invention

The present invention relates in general to circuit boards held within a shelf holder, and more particularly, to a device for electrically connecting exposed back ends of circuit boards when held with the shelf holder.

2. Description of the Related Art

FIG. 1 shows a shelf holder 1 for holding circuit boards 2. The circuit boards have various semiconductor integrated circuits mounted and interconnected thereon. Each circuit board 2 inserted in the shelf 1 has a front connector (not shown) which connects to a shelf connector 6 within the shelf 1 when the circuit board 2 is inserted. The front connector and shelf connector 6 interconnect the various circuit boards. The end of the circuit board which is inserted in the shelf holder is referred to hereinafter as the "front end." The end of the circuit board which can be seen in FIG. 1 is referred to hereinafter as the "back end."

The shelf 1 has slots 8 which allow the circuit boards 2 to slide into the shelf 1. Each circuit board is provided with a keying bracket 10 having a protruding portion (not shown). For the circuit board to be completely inserted in the shelf 1, the protruding portion on the circuit board 2 must fit within the indentation 14 on the shelf 1.

FIGS. 2 and 3 show in detail locking mechanisms 16 (also referred to as "ejection mechanisms") mounted on a circuit board 2. FIG. 3 shows the ejection mechanism 16 in relation to the shelf 1. A top of the ejection mechanism is connected to a back end of the circuit board at pivot point 18 which allows a bottom of the ejection mechanism to moved toward and away from the circuit board 2. When the bottom of the ejection mechanism 16 is moved away from the circuit board 2, claw 20 is rotated toward the middle of the circuit board 2. At this position, the circuit board 2 is partially inserted into the shelf 1. After pivot point 18 passes an edge 22 (see FIG. 3) of shelf 1, the bottom of the ejection mechanism 16 is moved toward the circuit board 2. At this point claw 20 contacts edge 22. Further movement of the bottom end of ejection mechanism 16 toward shelf 1 pushes circuit board 2 into the shelf 1 to be completely received within shelf 1. At this point, front connector 4 (see FIG. 3) and shelf connector 6 are connected.

The ejection mechanism 16 has a movable locking mechanism 24 including a hook 26 which catches on projection 28. To release hook 26 from projection 28, lever 30 is moved. As the bottom of ejection mechanism 16 is moved away from the circuit board 2, surface 32 contacts shelf 1, ejecting the circuit board from the shelf.

It has been desired to use existing shelf configurations for high speed data transmission in a local area network (LAN) application. That is, it is a goal to be able to retrofit to achieve a LAN. Because of shelf constraints and other factors, LAN applications in existing shelf configuartions often require the use of three circuit boards 2. For example, a first circuit board may be an asynchronous transfer mode (ATM) board, a second circuit board may be an ATM processing unit (APU) board and a third circuit board may be the LAN board. The LAN board may be configured for an Ethernet type network or configured for a DS3 type network. The ATM board is usually flanked by the APU board and the LAN board.

When the shelf 1 is to be used for a LAN application, it is necessary for there to be many interconnections between the three boards of the LAN. While there are usually extra connections available with the shelf connector 6 and front connector 4, these extra connections are far from enough. It may be possible to provide additional interconnections in the vicinity of connectors 4, 6. However, the customer is clearly not able to modify the shelf holder, and the retrofitting is usually done on site. To achieve extra connections, it has been proposed to hard wire the three boards of a LAN application to one another. However, when inserting the three boards within the holder 1, the user would lock the boards into the holder one by one with the ejection mechanisms 16. If the user attempts to lock one board without simultaneously locking the other two, the position of that one board with respect to the other boards is changed, and this places too great a strain on the hard wired interconnections between the boards.

Moreover, if the three circuit boards are hard wired to one another, it is impossible for the user to change network configurations. If the user wants to use Ethernet rather than DS3, all three circuit boards must be replaced.

As an alternative to hard wiring, it has been proposed to mount additional pin connectors on the circuit board. Because of the large number of interconnections necessary, high density pin connectors have been used. For example, 125 pin pin connectors or 180 pin pin connectors may be used. For the APU board 180 pin pin connectors may be necessary. According to the proposal, these high density pin connectors were installed perpendicular to the surface of the board, and ribbon wiring was used to connect the pin connectors. However, the manual connection of the pin connectors with ribbon wiring was tedious, and alignment of the pins was difficult, especially in view of the three boards being parallel and closely spaced. Moreover, the ribbon wiring made insertion of the boards into the shelf difficult. Interconnection using ribbon wiring by an untrained customer is therefore not a feasible alternative.

SUMMARY OF THE INVENTION

Accordingly, it is an object of the present invention to provide additional interconnections for a plurality of circuit boards received in a holder without hard wiring the three circuit boards to one another.

It is a further object of the present invention to allow a LAN application to be retrofitted to an existing shelf configuration.

It is a still further object of the present invention to allow for one LAN board to be easily interchanged with another.

It is a yet further object of the present invention to avoid difficult manual pin alignment and board insertion problems associated with ribbon wiring between high density pin connectors.

These and other objects are achieved by providing a circuit board connecting device for electrically connecting exposed back ends of circuit boards when the front ends of the circuit boards are received in a holder, comprising first connectors attached respectively to the back ends of the circuit boards and extending lengthwise with the back ends of the circuit boards; second connectors adapted for connection respectively to the first connectors when the first and second connectors are aligned in a plane parallel to a plane in which the circuit boards extend; and a connector substrate having the second connectors attached thereto, extending perpendicular therefrom, the second connectors being electrically connected to each other on the connector substrate, the connector substrate being fixedly attached to one of the circuit boards.

The first and second connectors may be high density pin connectors. Because of the large number of pins involved with connecting a plurality of pin connectors, a rather large insertion force is necessary. Because the pins on high density pin connectors are very close to one another alignment was previously difficult. If alignment is not precisely correct the first time one attempts insertion, the pins may be bent, seriously damaging the circuit boards. The present invention avoids these problems by having the second pin connectors mounted on a connector substrate which is attached to one of the circuit boards. In this manner, one of the pin connectors is already connected, and thus, the insertion force is approximately two thirds of what would otherwise be necessary (if three circuit boards are used). Also, because the connector substrate is attached to one of the circuit boards, placing the circuit board in the indentation in the shelf to slide the circuit board into the shelf ensures that alignment with the other circuit boards will be correct.

BRIEF DESCRIPTION OF THE DRAWINGS

The invention is now explained in more detail in connection with several exemplary embodiments with the aid of the attached drawings in which like reference numerals represent like elements, wherein:

FIG. 7 is a perspective view of the connecting device shown in FIG. 4 showing connection to right and left additional circuit boards;

FIG. 8 is a partially removed perspective view of the right circuit board of the additional circuit boards shown in FIG. 7;

DETAILED DESCRIPTION OF THE PREFERRED EMBODIMENTS

Figure 1:
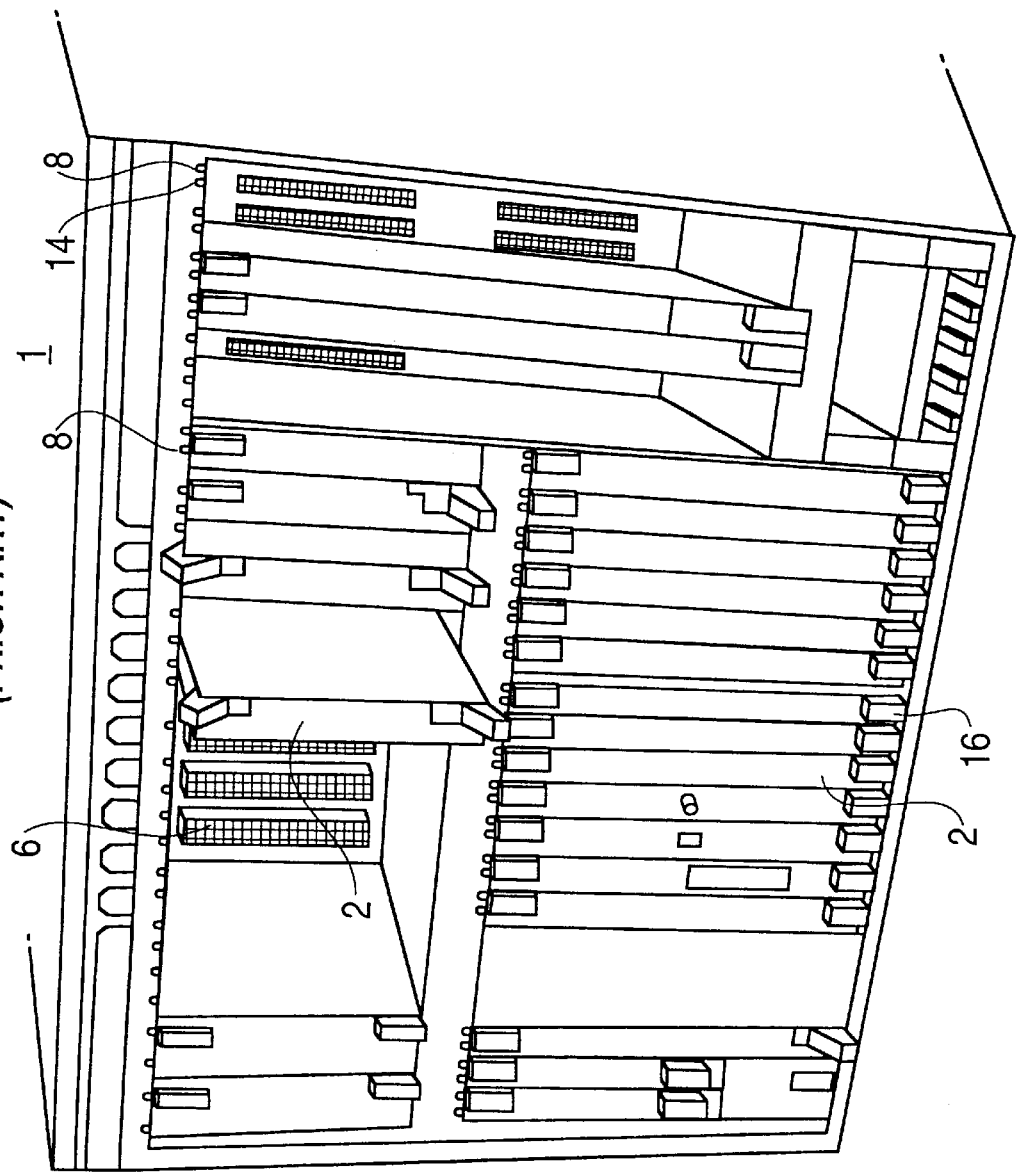
FIG. 1 is a perspective view of a shelf housing in which circuit boards are held.
Figure 2:
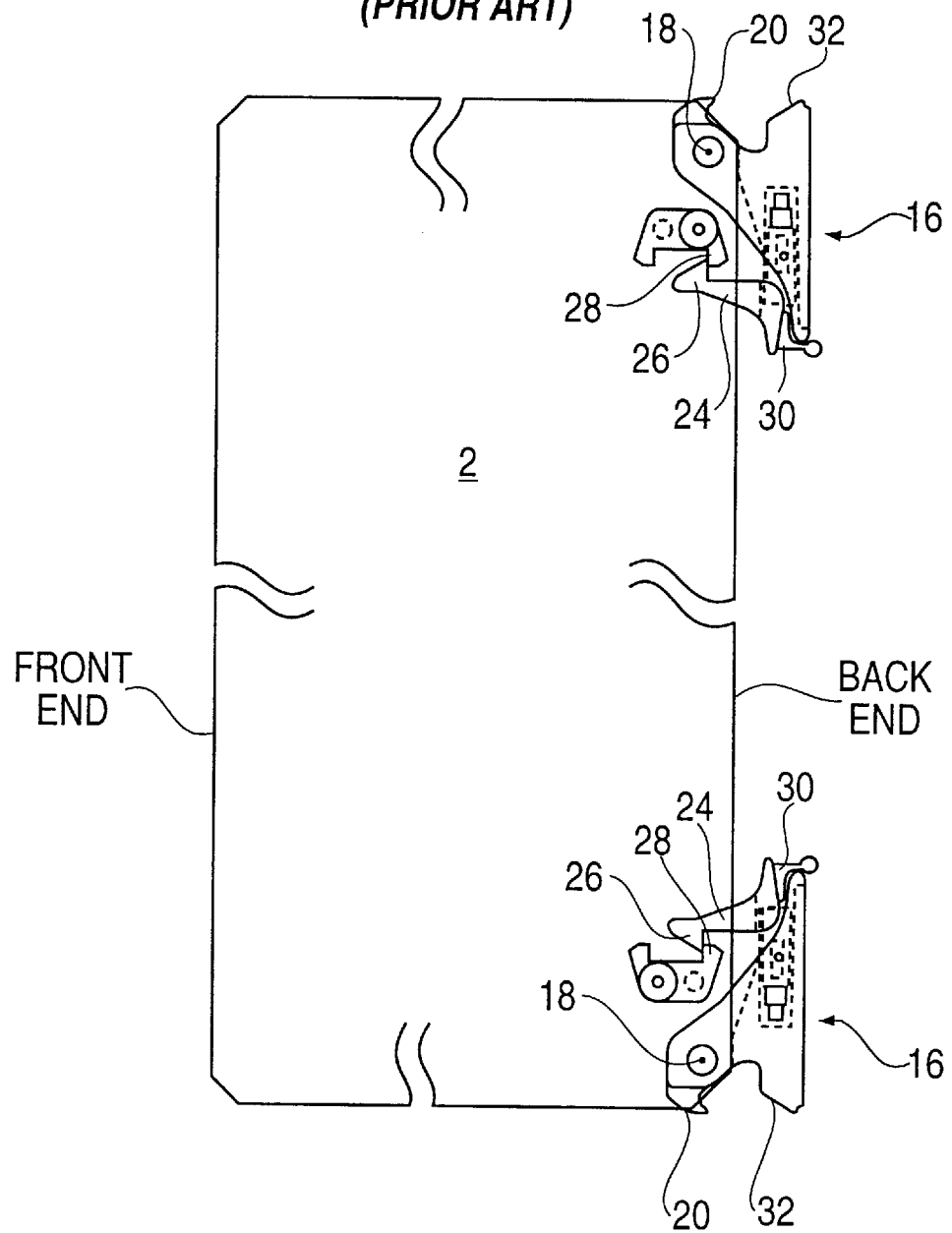
FIG. 2 is a partially removed planar view of a pair of ejection mechanisms attached to a circuit board.
Figure 3:
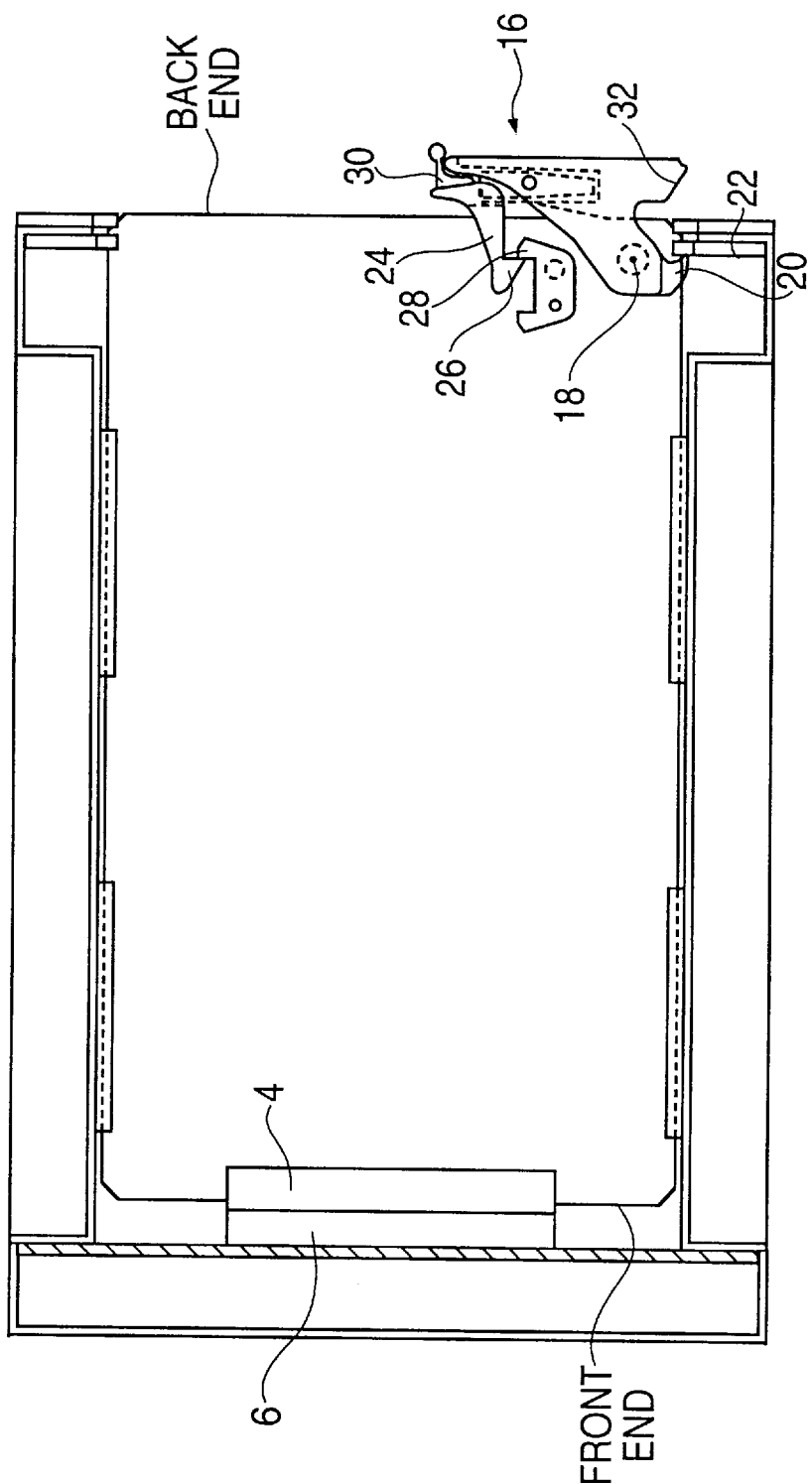
FIG. 3 is a partially removed side view of the ejection mechanism shown in FIG. 2 retaining the circuit board within the housing shown in FIG. 1.
Figure 4:
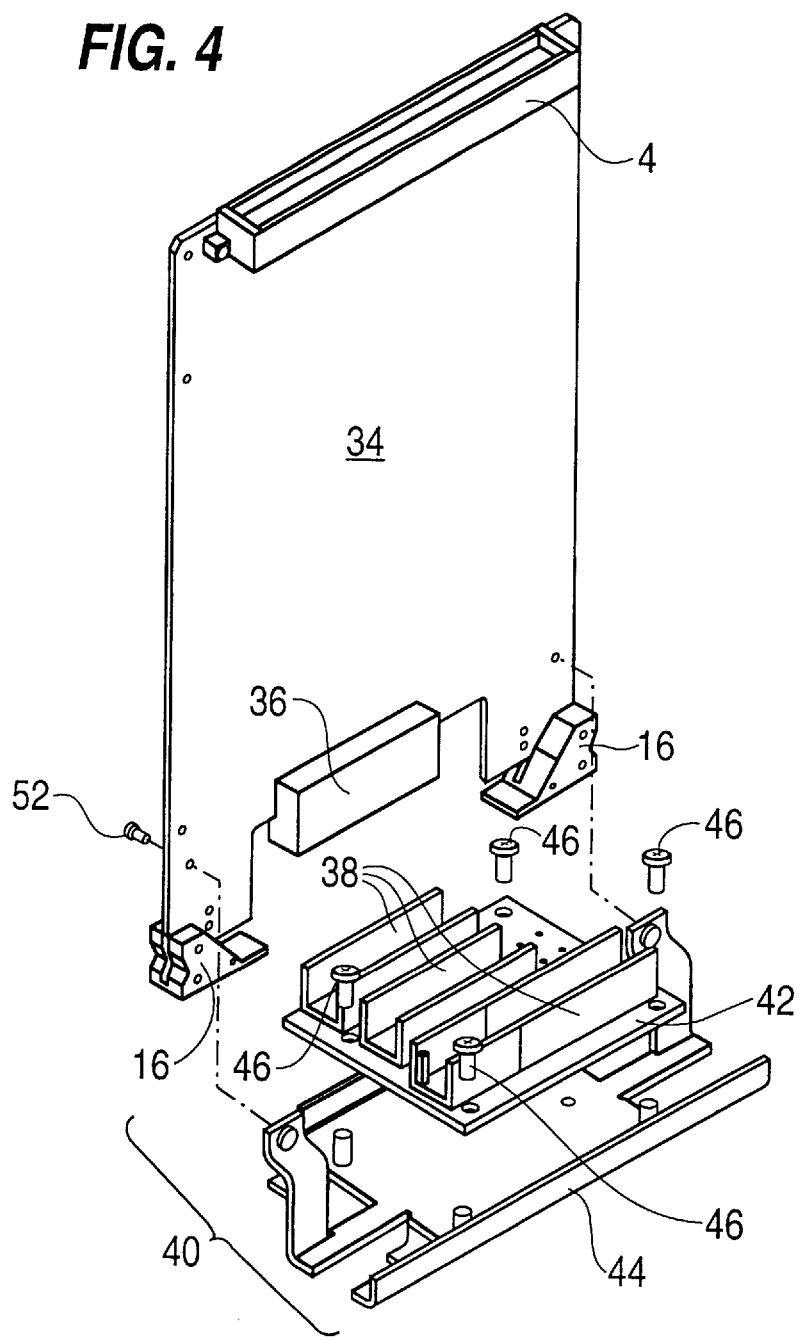
FIG. 4 is an exploded perspective view of a circuit board connecting device according to the present invention.
Figure 5:
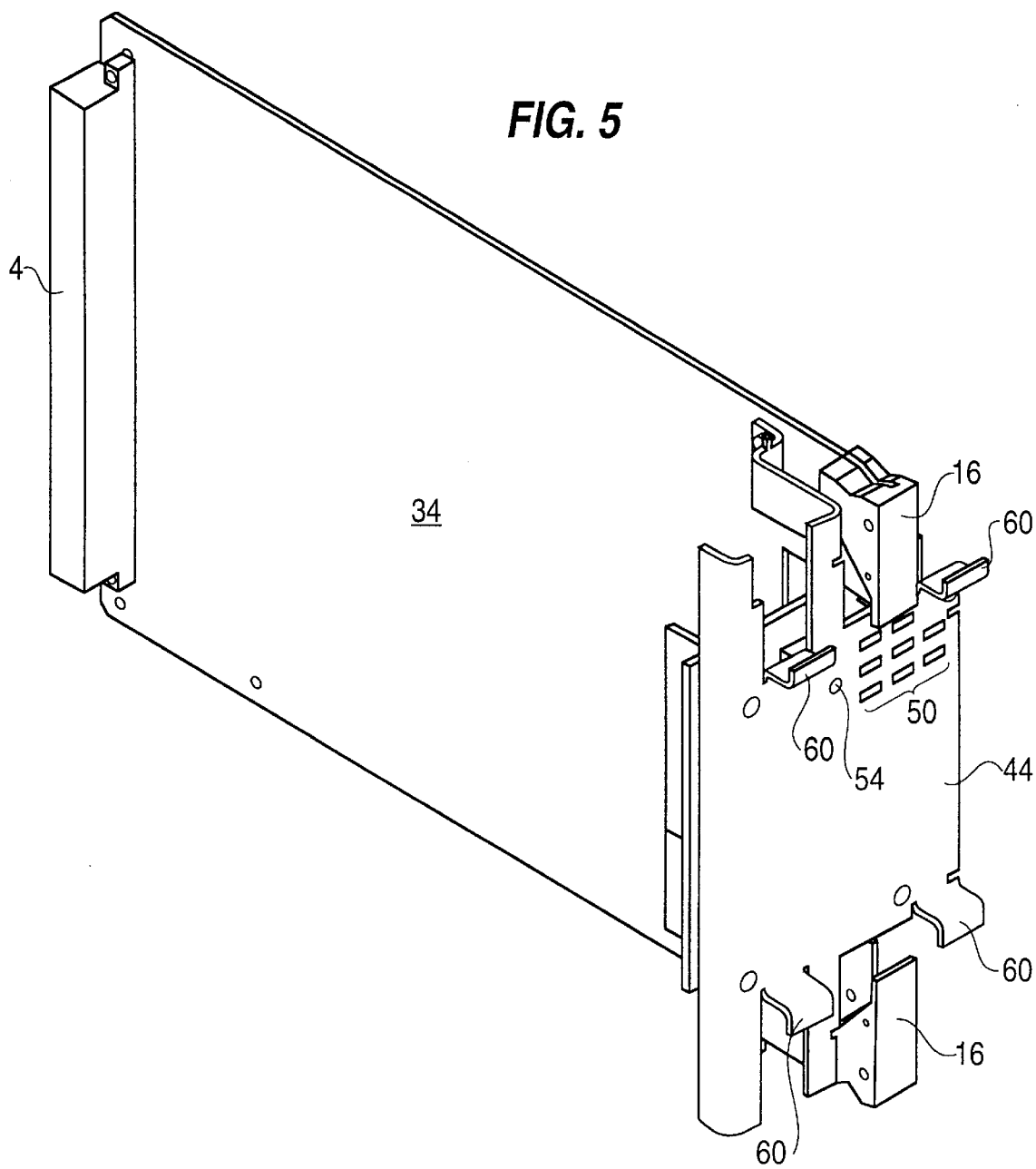
FIG. 5 is an assembled perspective view of the connecting device shown in FIG. 4.

FIG. 4 is an exploded perspective view of a circuit board connecting device according to the present invention. The connecting device is shown assembled in FIG. 5. FIG. 4 shows an ATM circuit board 34. Of course, circuit board 34, as well as the LAN board and APU board (described below) may be other types of circuit boards. At a front end of board 34 is mounted a front connector 4. A first connector 36 is attached to the back end of board 34 and extends lengthwise with the back end. The first connector 4 may be a high density female pin connector, such as those available from AMP. Board 34 also has two ejection mechanisms 16 mounted thereon. Three second connectors 38 are shown in FIG. 4, and the middle second connector 38 is connected to the first connector 36 on board 34 when the connecting device is assembled as shown in FIG. 5. Second pin connectors 38 may be high density male pin connectors, such as those available from AMP.

Figure 6:
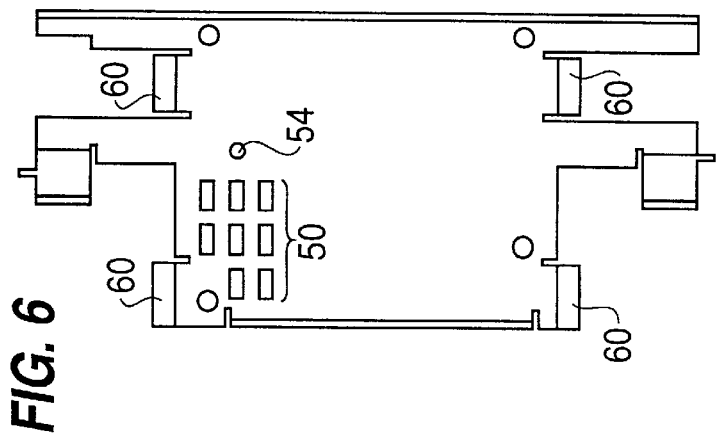
FIG. 6 is a rear plane view of a front plate for the connecting device shown in FIG. 4.

As can be seen in FIG. 4, the second connectors are attached to a connector substrate 40, perpendicular to the connector substrate 40. The connector substrate 40 includes a connector circuit board 42 which electrically connects the three second connectors 38. The connector substrate 40 also includes a front plate 44 which is attached to the connector circuit board 42 with screws 46. The front plate 44 is also shown in FIG. 6 and may be formed of sheet metal.

The surface (not shown) of the connector circuit board 42 which faces the front plate 44 may have LED indicators protruding therefrom. Such indicators may indicate input/output failure, whether each of three circuit boards of a LAN assembly are functioning properly, whether the power supply is functioning properly, etc. As can be seen in FIGS. 5–7, the front plate 44 has holes 50 which are at positions corresponding to the positions of the LED indicators. Holes 50 allow for the LED indicators to be seen through the front plate 44. A reset button is also provided on the surface of connector circuit board 42 which faces front plate 44. Reset hole 54 in front plate allows access to the reset button. Screws 52 secure the connector substrate 40 to circuit board 34 through the front plate 44.

FIG. 7 shows the connecting device as it would appear installed if the shelf was removed. That is, FIG. 7 shows ATM board 34 connected to a LAN board 56 and an APU board 58. To install the three boards and the connecting device in a shelf, the LAN board 56 and APU board 58 are slid into the shelf by fitting the boards 56, 58 into slots 8 in the shelf. The boards 56, 58 are then secured to the shelf with ejection mechanisms 16.

Thereafter, ATM board 34 is aligned with slots 8 in the shelf and slid into the shelf. At this point, bottoms of the ejection mechanisms 16 on board 34 are positioned away from the back end of board 34. When board 34 is almost completely within the shelf, the bottoms of ejection mechanisms 16 are moved toward the second end of board 34. This moves board 34 the remaining way into the shelf. Movement of the ejection mechanisms 16 connects the front connector 4 with a shelf connector 6 through movement of board 34. Also, movement of ejection mechanisms 16 connects the second connector 38 on either side of board 34 with the first connectors 36 on boards 56 and 58.

Ejection mechanisms 16 on board 34 are very important in ensuring proper connection. A considerable amount of force is necessary to connect connectors 4, 6, 36, 38 when board 34 is moved completely within the shelf. As can be seen, ejection mechanisms 16 are positioned at the top and bottom of board 34. Simultaneous movement of ejection mechanisms 16 applies force to the top and bottom of board 34, thus forcing board 34 straight into the shelf. Without the ejection mechanisms 16, it would be easy to force board 34 at an angle.

As can be seen in FIGS. 5 and 7, front plate 44 of the connector substrate 40 has covering portions 60 which are angled out away from a remainder of front plate 44. When the connecting device connects boards 34, 56, 58 as shown in FIG. 7, the covering portions 60 cover the back ends of the ejection mechanisms 16 mounted on boards 56, 58. In this manner, movable locking mechanisms 24 on ejection mechanisms 16 cannot be released and the back ends of ejection mechanisms cannot be moved away from boards 56, 58. Boards 56, 58 are therefore locked in place and cannot be removed without first removing the connecting device and board 34.

FIG. 8 is a perspective view of a LAN board 56. More specifically, board 56 is a DS3 LAN board. Board 56 has female cable connectors 62 mounted thereon. Cable connectors 62 may be conventional female SMB connectors allowing connection of coaxial cables. The cable connectors 62 receive cables directed therein in a direction parallel to the surface of the board 56. It is conceivable that the cable connectors 62 could be configured to directly face the outside the shelf. For example it is conceivable that cable connectors 62 could be accessed in the vicinity of front plate 44. However, cable connectors 62 are not used for Ethernet boards. Therefore, the provisions to allow for cable connectors 62 to accessed in the vicinity of front plate 44 would unnecessarily increase the cost of the product for customers who require Ethernet rather than DS3.

Figure 9:
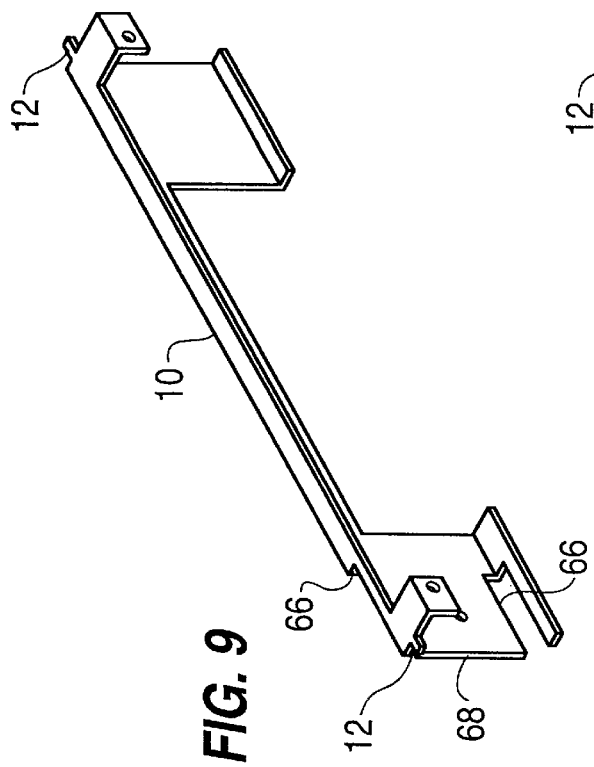
FIG. 9 is a keying bracket for the circuit board shown in FIG. 8.

A keying bracket 10 is mounted on board 56. Keying bracket 10 is also shown in FIG. 9. Keying bracket 10 has protruding portions 12. As described earlier, for the circuit board to be completely inserted in the shelf 1, the protruding portions 12 must fit within corresponding indentations 14 on the shelf 1.

Keying bracket 10 has removed portions 66 which allow coaxial cables connected to connectors 62 to pass through. That is, cables pass within removed portions 66 and behind plate portion 68. The depth of removed portions 66 is sufficient to allow the appropriate numbers of cables (in this case four) to pass therethrough. Removed portions 66 together with plate portion 68 form a throughway.

Figure 11:
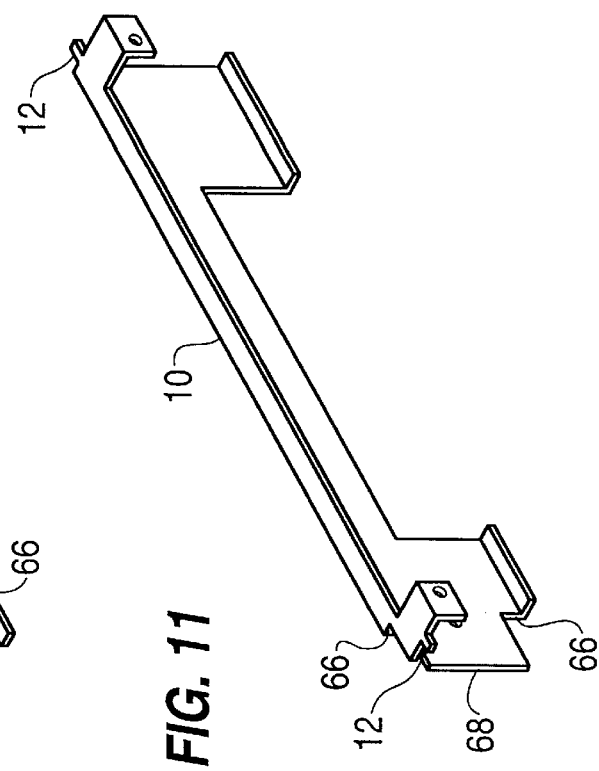
FIG. 11 is a keying bracket for the circuit board shown in FIG. 10.
Figure 10:
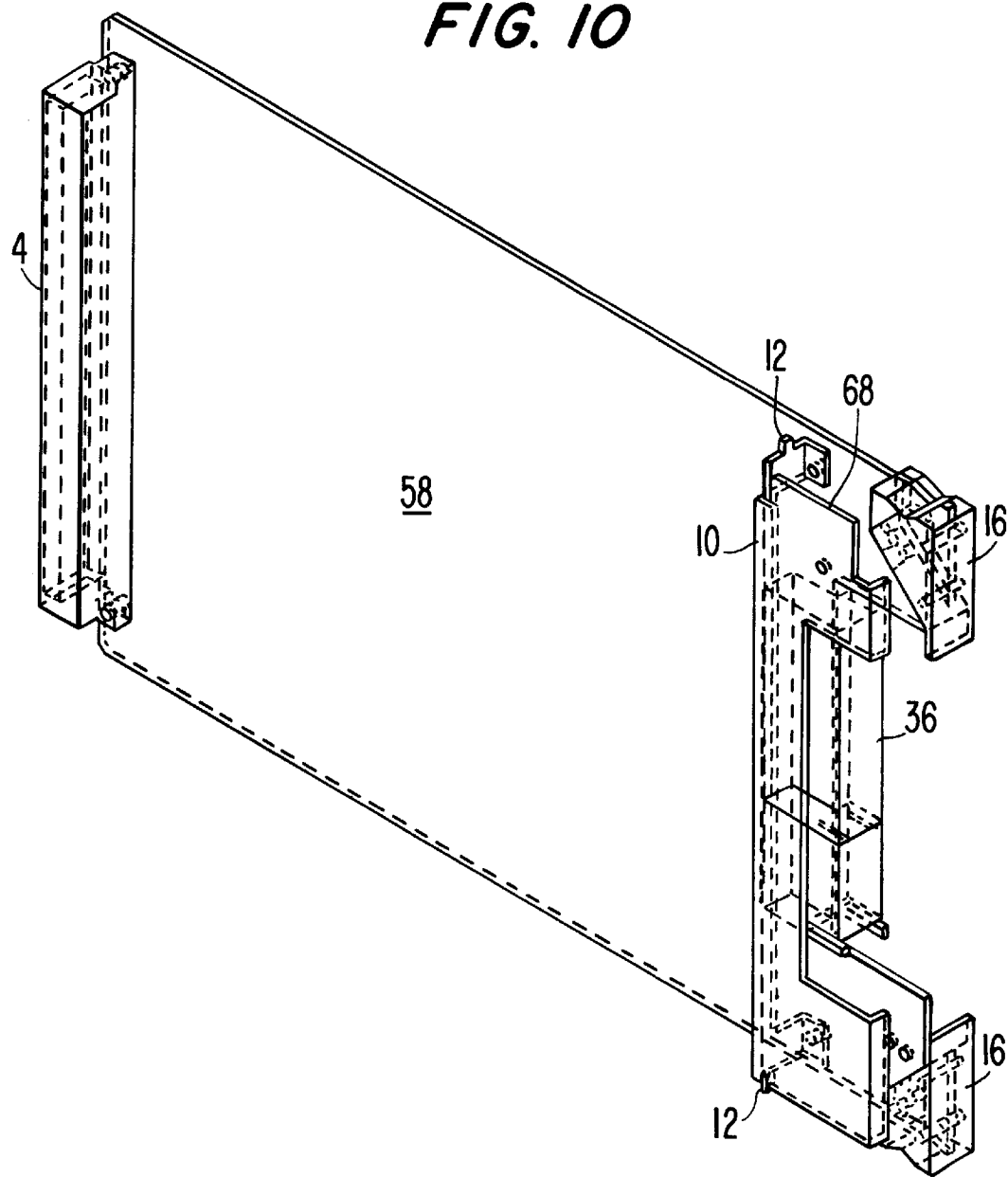
FIG. 10 is a partially removed perspective view of the left circuit board of the additional circuit boards shown in FIG. 7.

FIG. 10 shows APU board 58, which, although not shown, may have a female cable connector mounted thereon. Typically, there is one female cable connector mounted on APU board 58, while four female cable connectors are mounted on the LAN board 56. A keying bracket 10 shown also in FIG. 11 is mounted on APU board 58. As can be seen by comparing FIGS. 9 and 11, the depth of removed portions 66 on APU keying bracket 10 is less than the depth of removed portions 66 on LAN keying bracket 10. This is because removed portions 66 on APU keying bracket 10 must only accommodate one coaxial cable, whereas removed portions 66 on LAN keying bracket 10 must accommodate four coaxial cables.

First connector 36 shown in FIG. 10 mates with the second connector 38 shown at the bottom right of FIG. 4. As can be visualized from FIG. 4, the first and second connectors 36, 38 associated with the APU board 58 are larger than those associated with ATM and LAN boards 34, 56. For example, the connectors associated with the ATM and LAN boards may be 125 pin connectors and the connectors associated with APU board 58 may be 180 pin connectors.

The present invention has second connectors 38 mounted on a connector substrate 40 which is attached to one of the circuit boards, perhaps the center circuit board. This ensures proper alignment, minimizes insertion forces and evenly and smoothly provides the insertion forces. Because the connector substrate 40 is not necessarily attached to all circuit boards, it is possible to exchange the other circuit boards. For example, an Ethernet LAN board may be replaced with a DS3 LAN board.

While the invention has been described in connection with preferred embodiments, it will be understood that modifications thereof within the principles outlined above will be evident to those skilled in the art. For example, connectors other than pin connectors may be used and more than or less than three circuit boards may be used. Thus, the invention is not limited to the preferred embodiments, but is intended to encompass such modifications.

What is claimed is:

1. A circuit board connecting device for electrically connecting exposed back ends of circuit boards when the front ends of the circuit boards are received in a holder, comprising:

first connectors attached respectively to the back ends of the circuit boards and extending lengthwise with the back ends of the circuit boards;

second connectors adapted for electrical connection respectively to the first connectors when the first and second connectors are aligned in a plane parallel to a plane in which the circuit boards extend;

a connector substrate having the second connectors attached thereto, extending perpendicular therefrom, the second connectors being electrically connected to each other on the connector substrate; and a distinct retaining mechanism in direct contact with one of the circuit boards, to fixedly attach the connector substrate to the one circuit board and maintain electrical connection of the first and second connectors associated with the one circuit board.

2. A circuit board connecting device for electrically connecting exposed back ends of circuit boards when the front ends of the circuit boards are received in a holder comprising:

first connectors attached respectively to the back ends of the circuit boards and extending lengthwise with the back ends of the circuit boards;

second connectors adapted for connection respectively to the first connectors when the first and second connectors are aligned in a plane parallel to a plane in which the circuit boards extend;

a connector substrate having the second connectors attached thereto, extending perpendicular therefrom, the second connectors being electrically connected to each other on the connector substrate, the connector substrate being fixedly attached to one of the circuit boards: and ejection mechanisms having tops attached respectively to the back ends of the circuit boards not attached to the connector substrate and bottoms moveable toward and away from the back ends of the circuit boards, each ejection mechanism retaining a corresponding circuit board within the holder when the bottom is moved toward the back end of the circuit board and each ejection mechanism releasing the corresponding circuit board from the holder when the bottom is moved away from the back end of the circuit board, wherein the connector substrate has covering portions which cover the bottoms of the ejection mechanisms and retain the bottoms towards the back ends, when the second connectors are attached to the first connectors.

3. A circuit board connecting device according to claim 2, wherein one of the ejection mechanisms is attached to the circuit board which is attached to the connector substrate, the connector substrate not having a covering portion covering the ejection mechanism attached to the circuit board attached to the connector substrate.

4. A circuit board connecting device according to claim 3, wherein each ejection mechanism has an inserting element so that when the circuit board is partially received within the holder, movement of the bottom of the ejection mechanism toward the back end of the circuit board activates the inserting element to move the circuit board to be completely received within the holder and thereby connect the first and second connectors, the circuit board attached to the connector substrate having two ejection mechanisms, one on either side of the first connector.

5. A circuit board connecting device according to claim 2, wherein the bottoms of the ejection mechanisms have movable locking mechanisms which must be released to allow the ejection mechanisms to be moved away from the back ends of the circuit boards, the covering portions preventing release of the movable locking mechanisms.

6. A circuit board connecting device according to claim 1, wherein the first connectors extend parallel to one another and the second connectors extend parallel to one another.

7. A circuit board connecting device according to claim 1, wherein the first connectors are female pin connectors and the second connectors are male pin connectors.

8. A circuit board connecting device for electrically connecting exposed back ends of circuit boards when the front ends of the circuit boards are received in a holder, comprising:

first connectors attached respectively to the back ends of the circuit boards and extending lengthwise with the back ends of the circuit boards;

second connectors adapted for connection respectively to the first connectors when the first and second connectors are aligned in a plane parallel to a plane in which the circuit boards extend;

a connector substrate having the second connectors attached thereto, extending perpendicular therefrom, the second connectors being electrically connected to each other on the connector substrate, the connector substrate being fixedly attached to one of the circuit boards;

a cable connector mounted on a circuit board not attached to the connector substrate; and a keying bracket attached to the back end of the circuit board having the cable connector mounted thereon, the keying bracket having a protruding portion matching an indentation on the holder to ensure proper placement of the circuit board, the keying bracket having a throughway allowing a cable to pass therethrough.

9. A circuit board connecting device according to claim 1, wherein circuit board connecting device electrically connects three parallel circuit boards received in the holder such that there are three first connectors and three second connectors, the circuit board positioned in the middle of the three circuit boards being one of the circuit boards attached to the connector substrate.

* * * * *